(12) United States Patent
Miller et al.

(10) Patent No.: US 8,673,436 B2
(45) Date of Patent: Mar. 18, 2014

(54) NANOENGINEERED MATERIAL FOR HYDROGEN STORAGE

(75) Inventors: Michael A. Miller, San Antonio, TX (US); Kent Edward Coulter, Bexar, TX (US); James H. Arps, Chanhassen, MN (US)

(73) Assignee: Southwest Research Institute, San Antonio, TX (US)

( * ) Notice: Subject to any disclaimer, the term of this patent is extended or adjusted under 35 U.S.C. 154(b) by 697 days.

(21) Appl. No.: 11/615,572

(22) Filed: Dec. 22, 2006

(65) Prior Publication Data
US 2008/0152883 A1 Jun. 26, 2008

(51) Int. Cl.
*B32B 5/16* (2006.01)
*B05D 3/00* (2006.01)
*C23C 16/00* (2006.01)

(52) U.S. Cl.
USPC ........ 428/220; 428/212; 428/328; 427/248.1; 241/1; 977/750; 977/752; 977/842

(58) Field of Classification Search
USPC ................. 429/218.2, 12; 428/212, 220, 328; 427/248.1; 241/1; 423/646
See application file for complete search history.

(56) References Cited

U.S. PATENT DOCUMENTS

| | | | |
|---|---|---|---|
| 5,279,805 A | 1/1994 | Miremadi et al. | |
| 5,803,976 A | 9/1998 | Baxter et al. | |
| 6,106,801 A | 8/2000 | Bogdanović et al. | |
| 6,159,538 A | 12/2000 | Rodriguez et al. | |
| 6,433,129 B1 * | 8/2002 | Amendola et al. | 528/271 |
| 6,541,974 B1 | 4/2003 | Schütz | |
| 6,596,055 B2 | 7/2003 | Cooper et al. | |
| 6,672,077 B1 | 1/2004 | Bradley et al. | |
| 6,830,725 B2 | 12/2004 | Fetcenko et al. | |
| 6,906,003 B2 | 6/2005 | Struthers et al. | |
| 6,918,430 B2 | 7/2005 | Myasnikov et al. | |
| 7,186,474 B2 | 3/2007 | Jang | |
| 2001/0018939 A1 | 9/2001 | Zaluska et al. | |
| 2002/0086113 A1 * | 7/2002 | Leigeber et al. | 427/331 |
| 2004/0142203 A1 | 7/2004 | Woolley | |
| 2004/0247521 A1 * | 12/2004 | Bogdanovic et al. | 423/644 |
| 2005/0069490 A1 | 3/2005 | Zhao et al. | |
| 2005/0074612 A1 | 4/2005 | Eklund et al. | |
| 2005/0092241 A1 | 5/2005 | Colibaba-Evulet | |
| 2005/0255382 A1 | 11/2005 | Young et al. | |
| 2006/0063003 A1 | 3/2006 | Yang et al. | |
| 2006/0194695 A1 | 8/2006 | Au | |

FOREIGN PATENT DOCUMENTS

| | | |
|---|---|---|
| WO | 97/26082 | 7/1997 |
| WO | 2005097671 A2 | 10/2005 |

OTHER PUBLICATIONS

Kishore et al. "Hydrogen storage in spherical and platelet palladium nanoparticles". published online Oct. 30, 2004. vol. 389, Issues 1-2. pp. 234-242.*

Seayad et al. "Recent Advances in Hydrogen Storage in Metal-Containing Inorganic Nanostructures and Related Materials". Advanced Materials, vol. 16, No. 9-10, pp. 765-777, (2004).*

(Continued)

*Primary Examiner* — Prashant J Khatri
(74) *Attorney, Agent, or Firm* — Grossman Tucker et al.

(57) ABSTRACT

The present invention relates to nanostructured material capable of storing hydrogen. The nanostructured material may be configured with a selected geometry to provide the capability to influence and increase the limiting or theoretical gravimetric storage level (GSL) of hydrogen for a given chemical composition.

9 Claims, 5 Drawing Sheets

(56) References Cited

OTHER PUBLICATIONS

Handbook of Nanotechnology. Ed. Bharat Bhushan, Springer-Verlag, 2004. Chapter 3.2, pp. 45-59.*
Copyright 1999 Information Access Company, a Thomson Corporation Company; ASAP; Copyright 1999 Society of Chemical Industry Chemistry and Industry. Nov. 1, 1999. Section: p. 839. Headline: Carbon: the key power; Statistical Data Included; British Crown copyright 1999/DERA. Published with the Defence Evaluation and Research Agency on behalf of the Controller HSMO. 8 pgs.
Copyright 1996 Reed Business Information UK, a division of Reed Elsevier, Inc. All Rights Reserved. New Scientist. Dec. 21, 1996. Section: Technology, p. 2020. Headline: Green cars go farther with graphite. www.newscientist.com. 2 pgs.
A.D. Lueking and R.T. Yang. Applied Catalysis A: General 265 (2004) 259-268. Hydrogen Spillover to Enhance Hydrogen Storage-Study of the Effect of Carbon Physicochemical Properties. © 2004 Elsevier B.V. All Rights Reserved. www.sciencedirect.com. 10 pgs.
Trygve Riis and Gary Sandrock et al. Hydrogen Storage—Gaps and Priorities. 2005. 13 pgs.
Parilla, et al., "Adsorption of Hydrogen on Carbon Single-Walled Nanotubes As Measured by the Volumetric Technique," Materials Research Society Symposium Proceedings, vol. 633, © 2001, pp. A14.36.1-A14.36.6.
Dillon, et al., "Evaluating the Purity of Single-Wall Nanotube Materials," Materials Research Society Symposium Proceedings, vol. 633, © 2001, pp. A.5.2.1-A5.2.6.
Coleman, et al., "Purity and Solubility of Nanotubes in Arc Discharge Carbon Powder," Materials Research Society Symposium Proceedings, vol. 633, © 2001, pp. A13.6.1-A13.6.5.
Heben, et al., "Rapid, Room Temperature, High-Density Hydrogen Adsorption on Single-Walled Carbon Nanotubes at Atmospheric Pressure Assisted by a Metal Alloy," Materials Research Society Symposium Proceedings, vol. 633, © 2001, pp. A9.1.1-A9.1.11.
Chambers, et al., "Hydrogen Storage in Graphite Nanotubes," The Journal of Physical Chemistry B, vol. 102, No. 22, dated May 28, 1998, pp. 4253-4256.

Li, et al., "Theoretical Evaluations of Hydrogen Storage Capacity n Pure Carbon Nanostructures," Journal of Chemical Physics, vol. 119, No. 4, dated Jul. 23, 2003, pp. 2376-2385.
Dillon, et al., "Storage of Hydrogen in Single-Walled Carbon Nanotubes," Nature, vol. 386, dated Mar. 27, 1997, pp. 377-379.
Li, et al., "Significantly Enhanced Hydrogen Storage in Metal-Organic Frameworks via Spillover," J. Am. Chem. Soc. 2006, vol. 128, No. 3, pp. 726-727.
Khoobiar, "Particle to Particle Migration of Hydrogen Atoms on Platinum-Alumina Catalysts from Particle to Neighboring Particles," The Journal of Physical Chemistry, vol. 68, No. 2, dated Feb. 1964, pp. 411-412.
Mitchell, et al., "Hydrogen Spillover on Carbon-Supported Metal Catalysts Studied by Inelastic Neutron Scattering. Surface Vibration States and Hydrogen Riding Modes," J. Phys. Chem B, vol. 107, No. 28, 2003, pp. 6838-6845.
Sermon, et al., "Hydrogen Spillover," Catalysis Reviews, 8(2), 211-239 (1973), pp. 211-239.
Sandrock, et al., "Effect of Ti-catalyst Content on the Reversible Hydrogen Storage Properties of the Sodium Alanates," Journal of Alloys and Compounds 339 (2002) pp. 299-308.
Bogdanovic, et al., "Ti-doped Alkali Metal Aluminium Hydrides as Potential Novel Reverible Hydrogen Storage Materials," Journal of Alloys and Compounds 253-254 (1997), pp. 1-9.
International Search Report and Written Opinion; date of mailing May 22, 2008; issued in corresponding International Appln. No. PCT/US07/88329 filed Dec. 20, 2007.
Van Den Berg, et al; "Materials for Hydrogen Storage: Current Research Trends and Perspectives"; The Royal Society of Chemistry 2008, ChemCommun, 2008, pp. 668-681.
Sahaym, et al Advances in the Application of Nanotechnology in Enabling a 'Hydrogen Economy'; J. Mater Science (2008) 43: pp. 5395-5429.
Satyapal, et al "The U.S. Department of Energy's National Hydrogen Storage Project: Progress Towards Meeting Hydrogen-Powered Vehicle Requirements"; ScienceDirect Catalysis Today; doi:10.1016/j.cattod.2006.09.022; CATTOD-4850; 11 pgs.
Supplementary European Search Report, date of completion Jun. 20, 2011, date of mailing Jul. 6, 2011; issued in related European Application No. 07869637.4 (6 pages).

* cited by examiner

NANOENGINEERED MATERIAL FOR HYDROGEN STORAGE

TECHNICAL FIELD

This disclosure relates to the solid-state storage of hydrogen. In particular, the present disclosure relates to hydrogen storage materials of selected size/geometry which may provide relatively high volumetric and/or gravimetric hydrogen storage capacity.

BACKGROUND

The storage and delivery of hydrogen under practical and safe conditions of temperature and pressure is arguably one of the greatest challenges facing the acceptance of hydrogen as an alternative fuel source for automotive propulsion, distributive energy, and industrial applications of the future. To achieve widest commercial acceptance, hydrogen storage systems may desirably exhibit relatively high volumetric and gravimetric capacity, relatively fast sorption kinetics at near ambient temperatures, and relatively high tolerance to recycling (i.e., charge and discharge cycles).

SUMMARY

In a first exemplary embodiment the present disclosure relates to a nanostructured material capable of storing hydrogen. The material may have a thickness (t) of less than or equal to about 100 nm, a lateral dimension (LD) of greater than or equal to about 1000 nm and an aspect ratio (LD/t) ≥10.0. The nanostructured material may therefore provide the capability to influence and increase the limiting or theoretical gravimetric storage level (GSL) of hydrogen for a given chemical composition.

In another exemplary embodiment the present disclosure relates to a solid-state hydrogen storage medium comprising particles, capable of storing hydrogen, having a thickness (t) of less than or equal to about 100 nm, a lateral dimension (LD) of greater than or equal to about 1000 nm and an aspect ratio (LD/t)≥10.0. The particles may be present in the storage medium with a value of free surface area ($SA_f$) divided by occupied volume (Vo) of greater than 10.

In another exemplary embodiment, the present disclosure relates a method of forming material for solid-state storage of hydrogen storage. A web of material may be supplied and the hydrogen storage material may be deposited onto the web. The material may be removed from the web and formed into a plurality of particles. As noted above, the particles may have a thickness (t) of less than or equal to about 100 nm, a lateral dimension (LD) of greater than or equal to about 1000 nm and an aspect ratio (LD/t)≥10.0. The particles may then be collected into a storage medium to provide for the reversible storage of hydrogen gas.

BRIEF DESCRIPTION OF THE DRAWINGS

Features and advantages of the disclosure will be apparent from the following detailed description of embodiments consistent therewith, which description should be considered with reference to the accompanying drawings, in which.

DETAILED DESCRIPTION

Figure 1:
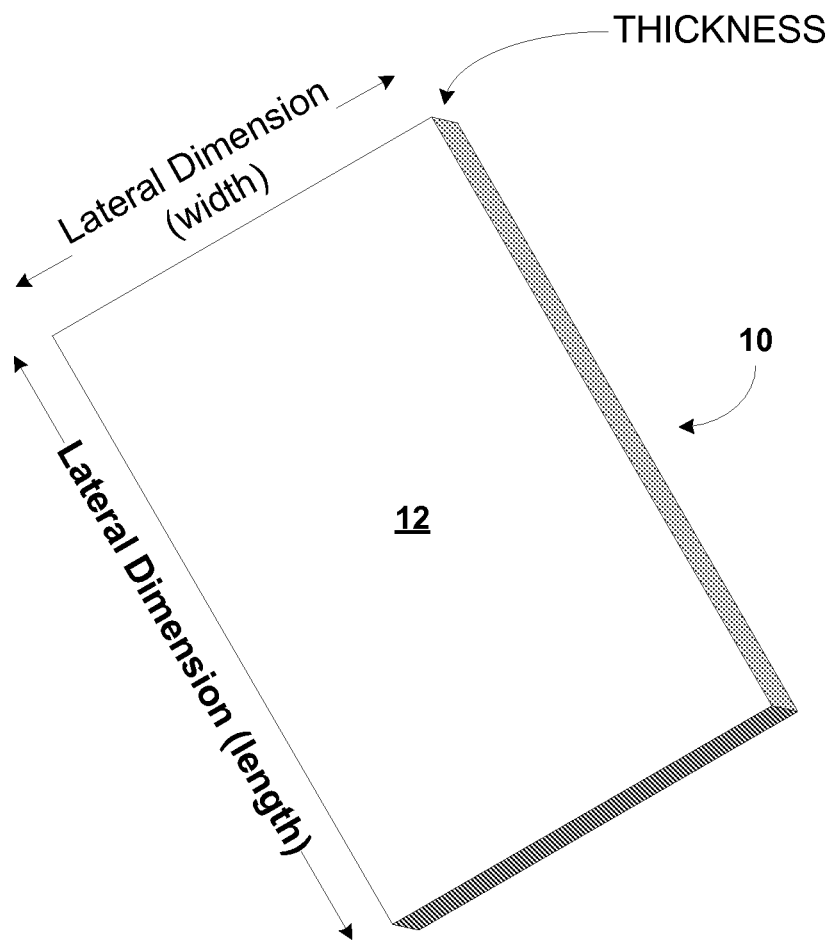
FIG. 1 is a schematic illustration of an exemplary hydrogen-absorbing particle.

As alluded to above, the present disclosure relates to the preparation of material of a nanostructured design that may be suitable for the storage of hydrogen. Such storage of hydrogen specifically contemplates the reversible storage of hydrogen, wherein hydrogen may be selectively absorbed or desorbed into the gas phase at a selected temperature. It is also contemplated herein that such storage of hydrogen may rely upon any sort of mechanism of absorption, such as physisorption and/or chemisoprtion along with corresponding release from a given hydrogen storage material composition.

The hydrogen storage material may therefore include any composition that is capable of solid-state hydrogen uptake and release. For example, any organic, inorganic, organic-inorganic, metallic, organometallic, and/or polymeric materials may be employed which may provide hydrogen storage. Such uptake of hydrogen for a given substrate may also be quantified by a consideration of, e.g., a gravimetric storage level (GSL), wherein it may be appreciated that a given material substrate composition may have a theoretical or limiting value ($GSL_{Limiting}$). For example, one class of storage materials herein specifically includes alkali metal aluminum hydrides of the following formula:

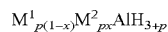

$$M^1{}_{p(1-x)}M^2{}_{px}AlH_{3+p}$$

wherein $M^1$ is selected from the group consisting of Na and K, $M^2$ is selected from the group consisting of Li and K, 0≤x≤0.8 and 1≤p≤3.0. In addition, such compounds may include a metal dopant to increase hydrogen storage capability. Such dopants may include any of the transition elements of the periodic table (e.g. Groups 1B-8B), iron, nickel and the rare earth metals, or a combination of said metals.

With respect to the above, one particular family of materials contemplated herein are alanates, which may be understood as the following aluminum based compounds with their associated theoretical or limiting gravimetric storage capacities and desorption temperatures: $LiAlH_4$ (10.6 wt. % $H_2$; 190° C.), $NaAlH_4$ (7.5 wt. % $H_2$; 100° C.), $Mg(AlH_4)$ (9.3 wt. % $H_2$; 140° C.) and $Ca(AlH_4)$ (7.8 wt. % $H_2$; >230° C.). A second family of materials contemplated herein include the following borohydrides, which are also identified with their associated limiting or theoretical gravimetric storage capacities and desorption temperatures: $LiBH_4$ (18.5 wt. % $H_2$; 300° C.), $NaBH_4$ (10.6 wt. % $H_2$; 350° C.), $KBH_4$ (7.4 wt. % $H_2$; 125° C.), $Be(BH_4)_2$ (20.8 wt. % $H_2$; 125° C.); $Mg(BH_4)_2$ (14.9 wt. % $H_2$; 320° C.); $Ca(BH_4)_2$ (11.6 wt. % $H_2$; 260° C.).

A third family of materials contemplated herein include nano-structured and amorphous carbon materials, such as, but not limited to, amorphous porous carbon, graphitic carbon, pyrolitic carbon, glassy carbon, diamond-like carbon and the like, or any combination thereof, and the catalytically-doped forms of the same. It is to be understood that undoped carbon materials exhibit a limiting gravimetric storage capacity of approximately 0.5 wt. % at room temperature and approximately 5 wt. % at 77 K, whereas the catalytically-doped forms of the same exhibit limiting capacities ranging 0.5 to 2.5 wt. % at room temperature. Catalysts for doping of such forms of carbon include transition metals of the periodic table, iron, nickel and the rare earth metals, or a combination of said metals.

In yet another family of materials contemplated herein, platelets may be composed of any of the above said materials and be further doped with a metal catalyst on their surface. The catalyst in this instance is capable of facilitating the growth of an alternate ordered material by whatever means, wherein this alternate material in and of itself is capable of solid-state hydrogen uptake and release. Alternate materials grown and supported on platelets include, but are not limited to, multi-wall carbon nanotubes (MWCNTs), single-wall carbon nanotubes (SWNTs), and the oxide of any metal or metalloid, or alloy of the same.

Figure 2:
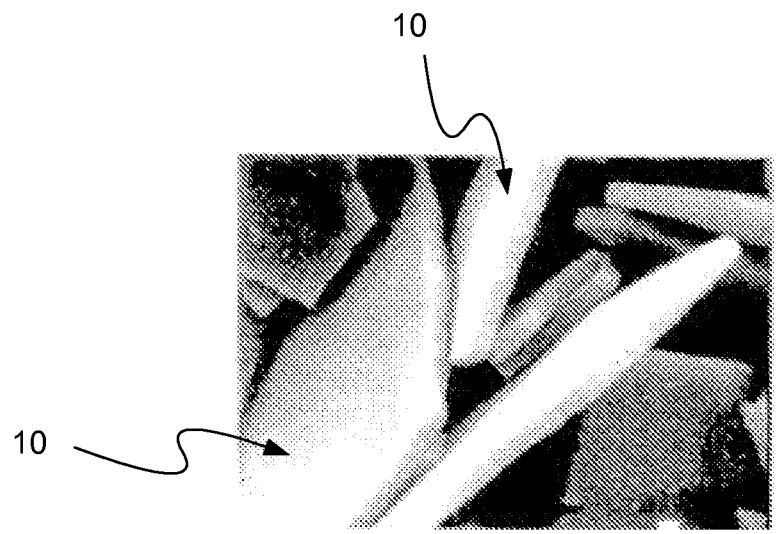
FIGS. 2-3 are electron micrograph of an exemplary hydrogen-absorbing particle.
Figure 3:
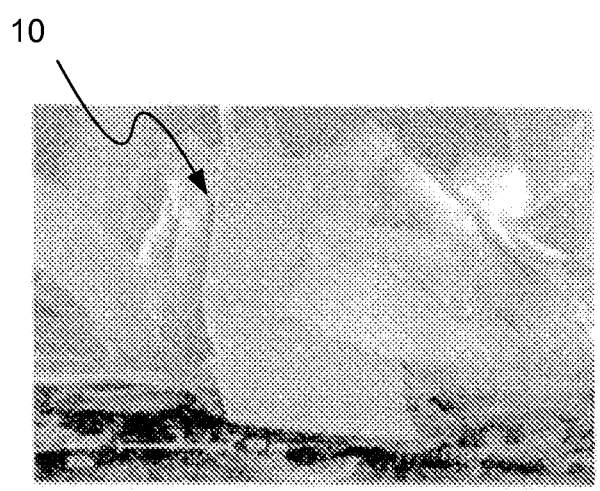

The hydrogen storage material herein may be configured into a desired nanostructure. In general terms, a nanostructure herein may be understood as a material that is microscopically two dimensional (e.g. a lateral dimension or "LD" of greater than or equal to about 1000 nm). It may also then include a nanoscopic thickness (e.g. a thickness "t" of less than or equal to about 100 nm). Accordingly, such nanostructures may have an aspect ratio (LD/t) of greater than or equal to about 10. With reference to FIG. 1, it may be seen that the material may amount to what may be termed a platelet particle 10 having a lateral dimension of length or width that along with thickness that defines a face surface 12. It should also be appreciated that while FIG. 1 illustrates general linearity with respect to the indicated lateral geometry of length and width, as well as linearity with respect to thickness, the platelets may be formed with relatively irregular boundaries and corresponding irregular three-dimensional shapes. This is illustrated by FIG. 2 and FIG. 3 which presents electron micrographs of a representative and exemplary formed platelet structure 10.

As the illustrated platelets 10 may assume the indicated dimensions, it can be appreciated that they may exhibit several advantages, such as increased surface area, anisotropic orientation, laminar flow behavior and conformal, coplanar packed structures on a surface. In that regard it may be appreciated that the platelets herein may provide the ability to achieve about 60% or greater of the limiting gravimetric hydrogen storage level, or $(0.6-1.0)(GSL_{Limiting})$, including all values and increments therein. With respect to geometric factors alone it may also be appreciated that there may be other important advantages with platelet structures over other geometries that may be realized in terms of the effective mass-normalized surface area. Referring to Table 1 below, a comparison of the calculated surface area and corresponding dimensions for particles of the same composition and mass are shown.

TABLE 1

| Geometry | Dimensions | Mass Normalized Surface Area ($m^2/g$) |
| --- | --- | --- |
| Platelet | 10 × 10 μm, 100 nm thick | 7.85 |
| Sphere | 2.7 μm diameter | 0.86 |
| Cube | 2.15 μm per side | 1.07 |
| Rod/wire | 1.1 μm diameter, 10 μm length | 1.36 |

As can be seen, other geometries may result in a relatively lower surface area to mass ratio compared to a given platelet. Accordingly, for particles of the same mass, no other geometry will readily allow one dimension in the nanometer length scale. Conversely, as shown in Table 2, if at least one dimension is held to about 100 nm for these shapes, a platelet may provide the lowest surface area to mass ratio.

TABLE 2

| Geometry | Dimensions | Mass Normalized Surface Area ($m^2/g$) | Particle Mass (relative to platelet) |
| --- | --- | --- | --- |
| Platelet | 10 × 10 μm, 100 nm thick | 7.85 | 1.0000000 |
| Sphere | 100 nm diameter | 23.1 | 0.0000524 |
| Cube | 100 nm per side | 23.1 | 0.0001000 |
| Rod/wire | 100 nm diameter, 10 μm length | 15.4 | 0.0000001 |

While the surface area increases, it may be appreciated that the relative weight of each particle may be at least four orders of magnitude lower than the representative platelet geometry. This may be problematic with respect to handling and manipulating bulk quantities of such material. Specific concerns include the health and safety hazards related to managing materials in the nanometer scale. A platelet design 10 therefore provides a method to take advantage of the unique properties afforded such nanostructured materials with dimensions for handling that may be acceptable in commercial markets.

It may therefore also be appreciated that with respect to the platelet dimensions noted above, when such platelets are contained within a given storage medium, the platelets may pack with a particular value of free surface area ($SA_f$) divided by occupied volume (Vo), or $SA_f/Vo$. Accordingly, the value of $SA_f/Vo$ herein for a collection of platelets within a given storage medium may be greater than 10. For example, the value of $SA_f/Vo$ may be greater than 100, or greater than 200, or greater than 500, etc. In addition, $SA_f/Vo$ may fall within the range of 10-1000, including all values and increments therein.

The above may be particularly underscored by first considering a storage medium of 100 generally spherical particles, having arbitrary dimensions, defining a diameter of 3 and a radius of 1.5. The $SA_f/Vo$ of such spherical particles may be calculated to a value of 1.5. By contrast, for a corresponding situation employing platelets herein, having, e.g., an aspect ratio of 1000, and a lateral dimension of 1.5, and a thickness of 0.0015, the $SA_f/Vo$ is about 591. It may therefore be appreciated that the platelet structures herein, providing a relatively large planar surface, and when packed with such a $SA_f/Vo$, may uniquely optimize the kinetics and thermodynamics of reversible hydrogen storage. Such platelet packing may also provide greater thermal conductivity to remove heat, when considering that hydrogen absorption is an exothermic process. In addition, when hydrogen sorption specifically proceeds from molecular hydrogen adsorbing at a surface site, followed by atomic hydrogen diffusing into the bulk until saturation or hydriding reactions are substantially complete, a platelet nano-architecture 10 with edge sites for adsorption and dissociation, and large areas for atomic hydrogen mobility, may further increase storage capacity.

Figure 4:
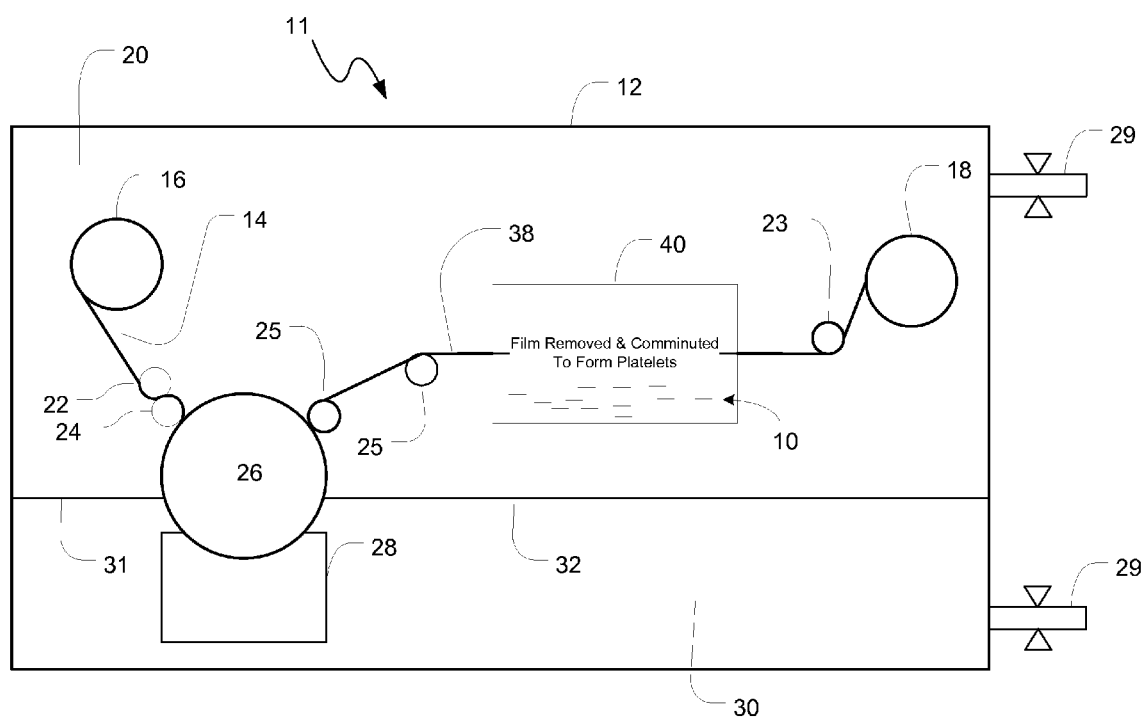
FIG. 4 is an exemplary a vacuum-based deposition system.

FIG. 4 illustrates one exemplary embodiment of a vacuum-based deposition system 10 suitable for the production of the above referenced hydrogen storage material. The vacuum-based deposition system 10 may include a vacuum chamber 12 for depositing one or more layers onto a web substrate 14 in order to provide films of nanometer thickness. A first and a second roll 16, 18 including the web substrate 14 may be loaded into a web compartment 20 of the vacuum chamber 12. The web substrate 14 may be threaded around one or more tensioning rolls 22 and 23, guide rolls 24 and 25, and an applicator roller 26 (such as, but not limited to, a chilled drum or the like) between the first and second rolls 16, 18. The web substrate 14 may include, but is not limited to, a substantially solid and/or continuous film as well as a partially porous or perforated film. For example, the web substrate 14 may include metal and/or ceramic films or foils, meshes and microfibers, as well as metal wires.

An advancing mechanism (not shown for clarity) such as, but not limited to one or more synchronized motors coupled to the first and second rolls 16, 18 may advance the web substrate 14 between the first and second rolls 16, 18 as needed. The advancing mechanism may advance the web substrate 14 in one direction (i.e., from the first roll 16 to the second roll 18) or alternatively may advance the web substrate 14 in both directions (i.e., from the first roll 16 to the second roll 18 and vice versa).

A thin-film depositor 28 may be located in a deposition compartment 30 of chamber 12 and may be separated from the web compartment 20 by one or more dividers 31, 32 which may extend inwardly from the inner wall of chamber 12 to a portion adjacent to a chilled drum 26. A small clearance may be provided between the dividers 31, 32 and the chilled drum 26 to allow the free passage of the web substrate 14 over the curved surface of the chilled drum 26 and into the deposition chamber 30, but may be sufficiently narrow to effectively separate the compartments 20 and 30 from each other. One or more ports 29 may be provided to evacuate the vacuum chamber 12, web compartment 20, and/or the deposition compartment 30. The ports 29 may also be used to introduce various gases into the vacuum chamber 12, web compartment 20, and/or the deposition compartment 30 such as, but not limited to, inert gases and the like.

The thin-film depositor 28 may include any device for depositing a film of material onto the web substrate 14 and/or onto previously deposited layers. While not an exhaustive list, the thin-film depositor 28 may comprise a chemical deposition depositor (such as, but not limited to, plating, chemical vapor deposition (CVD), plasma enhanced CVD, and the like), physical deposition and/or physical vapor deposition (PVD) depositor (such as, but not limited to, a thermal evaporator, an electron beam evaporator, sputtering such as ion-beam sputtering, ion-assisted sputtering, high target utilization sputtering, and the like, pulsed laser deposition, and the like), reactive sputtering, molecular beam epitaxy (MBE), as well as Topotaxy. It may therefore be appreciated that an exemplary thin film depositor may provide any one of the aforementioned solid-state hydrogen storage materials in vapor form by evaporation of the material followed by deposition on the advancing web.

The web substrate may therefore be advanced between the first and second rolls 16, 18, around the chilled roller 26, and through the thin-film depositor 28 wherein one or more layers may be applied by the thin-film depositor 28 onto the web substrate 14 and/or onto previously deposited layers. The speed in which the advancement mechanism passes the web substrate 14 through the thin-film depositor 28 may depend upon, among other variables, the deposition rate, the materials being applied, and the desired thickness of the layer.

Figure 5:
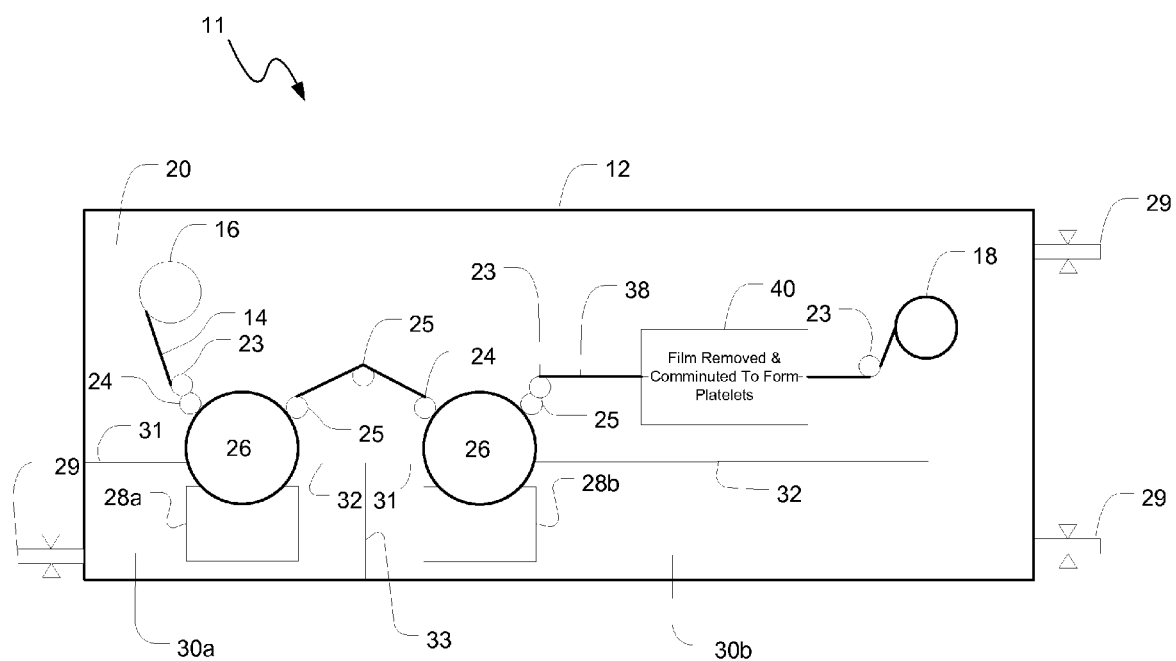
FIG. 5 is an exemplary vacuum-based deposition system for applying multiple layers in series.

Referring to FIG. 5, another embodiment of the vacuum-based deposition system 11 is shown comprising a plurality of thin-film depositors 28a, 28b which may be located in one or more deposition compartments 30a, 30b which may optionally be separated from each other and/or the web compartment 20 by one or more dividers 33. Each of the thin-film depositors 28a, 28b may apply one or more layers onto a first surface of the web substrate 14 and/or onto previously deposited layers. Such layers may be of the same or differing chemical composition, which may be understood as having a different chemical formula. For example, different types of alanates, or an alanate as one layer and a borohydride as another layer, etc.

Figure 6:
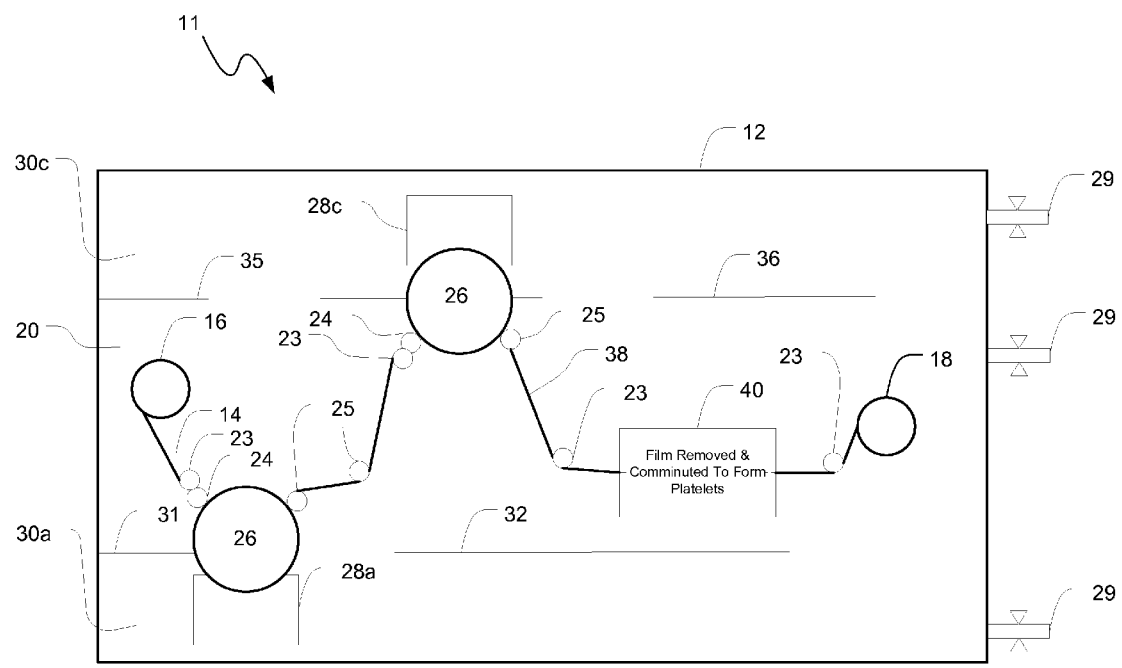
FIG. 6 is an exemplary embodiment of a vacuum-based deposition system for applying layers on generally opposite surfaces of a substrate web.

In addition to the above embodiments, and as shown in FIG. 6, the vacuum-based deposition system 11 may include a plurality of thin-film depositors 28a, 28c which may be located in one or more deposition compartments 30a, 30c which may optionally be separated from each other and/or the web compartment 20 by one or more dividers 31, 32, 35, 36. Each of the thin-film depositors 28a, 28c may apply one or more layers onto a first and a second surface of the web substrate 14 and/or onto previously deposited layers, respectively.

It should now be appreciated that the vacuum-based deposition system 11 may allow for the manufacture of unique alloys and accompany nanostructures, and combined functionalities (such as, but not limited to, catalysis and transport). Variables that may be adjusted include, but are not limited to, base pressure, deposition rate, deposition geometry, substrate temperature, tension on the substrate web 14, and the number of coating passes for a given hydrogen storage material.

In all of the above, it can now be appreciated that once the various layers have been applied to the web substrate 14, the resulting film 38 may be comminuted and physically converted into a platelet configuration. This is generally illustrated at 40 (see again, FIGS. 4-6) wherein a comminution device may be located within or coupled substantially adjacent to the vacuum chamber 12. Alternatively, the comminution machine 40 may be separate and distinct from the vacuum chamber 12. Locating the comminution device 40 within the vacuum chamber 12, however, may eliminate some of the problems associated with exposing the film 38 to the atmosphere (such as oxidation, pyrophoricity, and the like) and/or transporting the film 38 from one apparatus to another while eliminating exposure to the atmosphere. The comminution device 40 may also allow the film 38 to pass through unhindered such that all of the various layers may be applied to the web substrate 14 prior to comminuting the film 38. In this way, the substrate 14/film 38 may be wound/unwound between the first and second rolls 16, 18 until all the necessary layers are applied prior to comminuting the film 38. The comminution device 40 may include a fluid suspension-tank, colloid mill, sand mill, jet mill, roller mill, vibrating roller mill, supersonic/ultrasonic wave, or the like.

As mentioned above, the present disclosure is not intended to be limited to a structure, composition or method which must satisfy one or more of any stated or implied object or feature of the invention and should not be limited to any exemplary embodiment(s) described herein. The foregoing description of the present disclosure has been presented for purposes of illustration and description. It is not intended to be exhaustive or to limit the present disclosure to the precise form disclosed. Modifications or variations are possible in light of the above teachings. All such modifications and variations are therefore considered to be within the scope of the present disclosure.

What is claimed is:

1. A solid-state hydrogen storage medium, comprising:
   hydride particles selected from the group of alkali metal aluminum hydrides or alkali metal borohydrides doped with a metal catalyst and including an alternate material wherein said metal catalyst facilitates the growth of said alternate material and comprises a rare earth metal; and
   said alternate material comprising multi-wall carbon nanotubes and/or single-wall carbon nanotubes, wherein said alternate material is supported by the particles and said alternate material is capable of solid-state hydrogen uptake and release, and having a limiting gravimetric storage capacity of 0.5 wt. % to 2.5 wt. % at room temperature and 5.0 wt. % at 77 K;

wherein said particles have a thickness (t) of less than or equal to about 100 nm, a lateral dimension (LD) of greater than 1000 nm and an aspect ratio (LD/t)>10.0, wherein said particles are present with a free surface area (SA$_f$) divided by occupied volume (Vo) of greater than 10 and said particles have a limiting gravimetric storage level (GSL$_{Limiting}$) and said particles exhibit 0.6-1.0 GSL$_{Limiting}$;

wherein said particles when in said storage medium remove heat during exothermic hydrogen absorption where said hydrogen absorption proceeds from molecular hydrogen absorbing at a surface of said particles followed by atomic hydrogen diffusing into said particles.

2. The storage medium of claim 1 wherein said particles comprise an alkali metal aluminum hydride of the following formula:

$$M^1{}_{p(1-x)}M^2{}_{px}AlH_{3+p}$$

wherein M$^1$ is selected from the group consisting of Na and K;
M$^2$ is selected from the group consisting of Li and K;
0<x<0.8; and
1<p<3.0.

3. The particles of claim 1 wherein said particles comprises a borohydride selected from the group consisting of LiBH$_4$, NaBH$_4$, KBH$_4$, Be(BH$_4$)$_2$, Mg(BH$_4$)$_2$, Ca(BH$_4$)$_2$ and mixtures thereof.

4. The particles of claim 1 wherein each of said particles capable of hydrogen storage comprises at least two layers, each of said layers comprising a different chemical composition.

5. A method comprising:
providing a web material and vapor depositing alkali metal aluminum hydrides and/or alkali metal borohydride material on said web;
removing the material from said web;
comminuting said material, forming a plurality of particles capable of hydrogen storage having a thickness (t) of less than or equal to about 100 nm, a lateral dimension (LD) of greater than 1000 nm and an aspect ratio (LD/t)>10.0, wherein said particles are present in a storage medium with a free surface area (SA$_f$) divided by occupied volume (Vo) of greater than 10 and said particles have a limiting gravimetric storage level (GSL$_{Limiting}$) and said particles exhibit 0.6-1.0 GSL$_{Limiting}$;

doping said particles with a metal catalyst capable of facilitating the growth of an alternate material, wherein said metal catalyst comprises a rare earth metal; and growing on said particles the alternate material which comprises multi-wall carbon nanotubes and/or single-wall carbon nanotubes, wherein said alternate material is supported on said platelets and capable of solid-state hydrogen uptake and release and having a limiting gravimetric storage capacity of 0.5 wt. % to 2.5 wt. % at room temperature and 5.0 wt. % at 77 K;

wherein said particles when in said storage medium remove heat during exothermic hydrogen absorption where said hydrogen absorption proceeds from molecular hydrogen absorbing at a surface of said particles followed by atomic hydrogen diffusing into said particles.

6. The method of claim 5 wherein said alkali metal aluminum hydride material comprises an alkali metal aluminum hydride of the following formula:

$$M^1{}_{p(1-x)}M^2{}_{px}AlH_{3+p}$$

wherein M$^1$ is selected from the group consisting of Na and K;
M$^2$ is selected from the group consisting of Li and K;
0<x<0.8; and
1<p<3.0.

7. The method of claim 5 wherein said alkali metal borohydride material comprises a borohydride selected from the group consisting of LiBH$_4$, NaBH$_4$, KBH$_4$, Be(BH$_4$)$_2$, Mg(BH$_4$)$_2$, Ca(BH$_4$)$_2$ and mixtures thereof.

8. The method of claim 5 wherein said deposition of material on said web comprises depositing at least two materials having different chemical compositions.

9. The method of claim 5 including collecting the particles in a storage medium wherein said storage medium provides for the reversible storage of hydrogen.

* * * * *